United States Patent [19]

Beele

[11] Patent Number: 5,740,515
[45] Date of Patent: Apr. 14, 1998

[54] EROSION/CORROSION PROTECTIVE COATING FOR HIGH-TEMPERATURE COMPONENTS

[75] Inventor: Wolfram Beele, Aachen, Germany

[73] Assignee: Siemens Aktiengesellschaft, Munich, Germany

[21] Appl. No.: 417,945

[22] Filed: Apr. 6, 1995

[51] Int. Cl.$^6$ ................................................ B22F 5/04
[52] U.S. Cl. ........................ 428/552; 428/553; 428/554; 428/555; 428/615; 428/621; 428/629; 428/632; 427/248.1; 427/419.1; 427/419.7; 427/453
[58] Field of Search ........................ 428/548, 551, 428/552, 553, 554, 555, 556, 557, 565, 615, 621, 629, 632; 427/453, 248.1, 419.1, 419.7

[56] References Cited

U.S. PATENT DOCUMENTS

| | | | |
|---|---|---|---|
| 2,878,554 | 3/1959 | Long | 29/198 |
| 3,383,235 | 5/1968 | Blackburn et al. | 117/70 |
| 3,540,863 | 11/1970 | Priceman et al. | 29/191.2 |
| 3,574,572 | 4/1971 | Friedrich et al. | 29/198 |
| 3,595,633 | 7/1971 | Friedrich et al. | 29/198 |
| 4,055,705 | 10/1977 | Stecura et al. | 428/633 |
| 4,321,310 | 3/1982 | Ulion et al. | 428/612 |
| 4,321,311 | 3/1982 | Strangman | 428/623 |
| 4,656,099 | 4/1987 | Sievers | 428/610 |
| 4,889,776 | 12/1989 | Priceman | 428/629 |
| 5,035,957 | 7/1991 | Bartlett et al. | 428/552 |
| 5,087,477 | 2/1992 | Giggins et al. | 427/38 |
| 5,238,752 | 8/1993 | Duderstadt | 428/623 |
| 5,262,245 | 11/1993 | Ulion et al. | 428/469 |
| 5,401,307 | 3/1995 | Czech et al. | 106/14.05 |
| 5,472,487 | 12/1995 | Chin et al. | 106/287.11 |

OTHER PUBLICATIONS

Werkstoffkund und Werkstofftechnik Publiction 1979 (Dienst), pp. 90–103, "Hoch–Temperature–Werkstoffe".

*Primary Examiner*—Kathryn L. Gorgos
*Assistant Examiner*—Chrisman D. Carroll
*Attorney, Agent, or Firm*—Herbert L. Lerner; Laurence A. Greenberg

[57] ABSTRACT

An article of manufacture which is subject to erosive and corrosive attack in a high-temperature environment is formed of a substrate of nickel or cobalt-based superalloy, and a protective silicide coating disposed on the substrate. A thermal barrier layer of ceramic may be disposed between the superalloy and the silicide layer, and an MCrAlY layer may be disposed between the ceramic and the superalloy substrate. The silicide coating is preferably $MoSi_2$.

19 Claims, 2 Drawing Sheets

EROSION/CORROSION PROTECTIVE COATING FOR HIGH-TEMPERATURE COMPONENTS

BACKGROUND OF THE INVENTION

1. Field of the Invention

The invention relates to an article of manufacture and to a method of protecting the article against erosive and corrosive attack including particle impact damage in a high-temperature environment.

2. Description of the Related Art

U.S. Pat. No. 4,055,705 to Stecura et al.; U.S. Pat. No. 4,321,310 to Ulion et al.; and U.S. Pat. No. 4,321,311 to Strangman disclose coating systems for gas turbine components made from nickel or cobalt-based superalloys. A coating system described comprises a thermal barrier layer made from ceramic, which in particular has a columnar grained structure, disposed on a bonding layer or bond coating which in its turn is disposed on the substrate and bonds the thermal barrier layer to the substrate. The bonding layer or bond coating is made from an alloy of the MCrAlY type, namely an alloy containing chromium, aluminum and a rare earth metal such as yttrium in a base comprising at least one of iron, cobalt and nickel. Further elements can also be present in an MCrAlY alloy, and examples are given below. An important feature of the bonding layer is that a thin alumina layer developed on the MCrAlY alloy anchors the thermal barrier layer.

U.S. Pat. No. 5,238,752 to Duderstadt et al. discloses a coating system for a gas turbine component which also incorporates a ceramic thermal barrier layer and a bonding layer or bond coating bonding the thermal barrier layer to the substrate. The bonding layer is made from an intermetallic aluminide compound, in particular nickel aluminide or platinum aluminide. The interface layer also has a thin alumina layer which serves to anchor the thermal barrier layer.

U.S. Pat. No. 5,262,245 to Ulion et al. describes a result of an effort to simplify coating systems incorporating thermal barrier layers for gas turbine components by avoiding a bonding layer. To this end, a composition for a superalloy is disclosed which may be used to form a substrate of a gas turbine component and which develops an alumina layer on its outer surfaces under a suitable treatment. That alumina layer is used to anchor a ceramic thermal barrier layer directly on the substrate, eliminating the need for a special bonding layer to be interposed between the substrate and the thermal barrier layer.

U.S. Pat. No. 5,087,477 to Giggins et al. shows a method for applying a ceramic thermal barrier layer to a gas turbine component by physical vapor deposition (PVD) which comprises evaporating compounds forming the thermal barrier layer with an electron beam and establishing an atmosphere having a controlled content of oxygen at the component to receive the thermal barrier layer.

U.S. Pat. Nos. 5,154,885, 5,268,238, 5,273,712 and 5,401,307 to Czech et al. disclose advanced coating systems for gas turbine components comprising protective coatings of MCrAlY alloys. The MCrAlY alloys disclosed have carefully balanced compositions to give exceptionally good resistance to corrosion and to oxidation, as well as an exceptionally good compatibility (mechanical, chemical) to the superalloys used for the substrates. The basis of the MCrAlY alloys is formed by nickel and/or cobalt. Additions of further elements, in particular silicon and rhenium, are also discussed. Rhenium in particular is shown to be a very advantageous additive. All MCrAlY alloys shown are also very suitable as bonding layers for anchoring thermal barrier coatings, particularly in the context of the invention disclosed hereinbelow.

Articles of manufacture like gas turbine components being subject to corrosive attack at elevated temperatures (including attack by oxidizing materials and by other aggressive chemicals), as is broadly discussed in the state of the art, are frequently also subject to erosive attack.

This is particularly true for gas turbine components which are exposed to a hot gas stream which may carry solid particles, such as ash particles dispersed therein, and subject the gas turbine components to erosive attack by these particles.

A metallic protective coating is inherently fairly ductile at the temperatures in question and may not be too vulnerable under such erosive attack. If such protective coating is hit by a particle, the particle will stick to the coating, which might even be deformed thereby, but not very likely crack or even spall from the substrate.

The situation is quite different with a ceramic thermal barrier layer forming the surface of a gas turbine component and being subject to an erosive attack. Due to the inherent brittleness of the ceramic, cracking and spalling must be expected, if the ceramic is hit or impacted by a particle swept along with a hot gas stream streaming along the component.

Increased erosive attack is most likely to be expected at regions of the surface of the component—termed "critical regions" hereinafter—which are exposed more or less transversely to the hot gas stream streaming along. For an airfoil component of a gas turbine which includes a holding portion to be used for fixing the component and an airfoil portion which will be subjected to the hot gas stream in the gas turbine, a critical region will encompass a leading edge of the airfoil portion, the leading edge being defined by the gas stream streaming along the component.

The erosive attack hereinbefore described has not yet been fully recognized or even commented on by technicians working in the field. Known means which might eventually avoid the problem of erosion however only avoid contamination of the hot gas stream with particles, which not only imposes stringent requirements on the purity of fuels which may be used in a gas turbine but also requires that any ceramic to be installed in the gas turbine, eventually as a combustion unit heat shield, must be carefully selected to be of a type which is most unlikely to release particles to an appreciable extent. An alternative might eventually be relying on ceramic thermal barrier layers only outside of critical regions of the components as defined above.

This however implies that the critical regions must be protected only by metallic coatings, which due to the absence of thermal shielding in turn require a greatly enhanced cooling. The potential of ceramic thermal barrier coatings cannot thereby be utilized as fully as it should be possible.

Another drawback of the state of the art is to be seen in that the potential of known coating systems with regard to thermal loading might soon be exhausted in view of an increasing demand to improve the thermal efficiency of gas turbine engines, which in its turn requires to enhance the temperature at which a hot gas stream enters a gas turbine. Therefore, there is a continuing need to devise protective coating systems which offer protection against corrosion as well as erosion at temperatures which have heretofore been accessible only with ceramic thermal barrier coatings and by accepting their problems with regard to erosion attacks, as explained hereinabove. Such new protective coating systems need not necessarily incorporate ceramic layers, particularly if the thermal loads to be expected are not too high or if advanced substrates having sufficiently high thermal loading capabilities are used. Such advanced substrates might well be ceramic substrates.

SUMMARY OF THE INVENTION

It is accordingly an object of the invention to provide an erosion/corrosion protective coating for high-temperature components and a method of protecting such components, which overcomes the hereinafore-mentioned disadvantages of the heretofore-known devices and methods of this general type. The novel protective coating must be sufficiently ductile at the elevated temperatures in question, and thus protect the underlying structure against erosion including particle impact damage, and it must be sufficiently corrosion-resistant to withstand any corrosive attack for an extended period of time. The novel coating must furthermore exhibit properties, such as a thermal expansion coefficient and other mechanical/chemical behavior, which make it maximally compatible with the underlying structures, and particularly with the superalloys in question.

With the foregoing and other objects in view there is provided, in accordance with the invention, an article of manufacture which is subject to erosive and corrosive attack, comprising: a substrate, formed of a nickel or cobalt-based superalloy; and a silicide coating disposed on the substrate.

In accordance with an added feature of the invention, the silicide coating contains $MoSi_2$, preferably as a principal constituent, or it is solely formed of $MoSi_2$.

In accordance with an additional feature of the invention, the article of manufacture is a gas turbine airfoil component with an airfoil portion and a mounting portion, the airfoil portion being defined as being exposed to a gas stream streaming along the article during operation, having a leading edge and a trailing edge as defined by the gas stream streaming along, and having a convex suction side and a concave pressure side, both connecting said leading edge to said trailing edge. The airfoil portion has its leading edge defined by its orientation in the gas stream, and the silicide coating is preferredly disposed on and covers a critical region on the airfoil encompassing the leading edge. The airfoil portion also has its trailing edge defined by its orientation in the gas stream, and the silicide coating it preferredly disposed on and covers a critical region on the pressure side of the airfoil adjacent to the trailing edge.

The airfoil portion has a critical region which is subject to erosive attack by particles in the gas stream. In accordance with another feature of the invention, the silicide coating is disposed on and covers the critical region.

With the foregoing and other objects in view, there is also provided, in accordance with the invention, an article of manufacture being subject to erosive and corrosive attack, comprising: a substrate, formed of a nickel or cobalt-based superalloy; a thermal barrier layer disposed on the substrate and having a given ductility; and a protective coating disposed on the thermal barrier layer and having a relatively higher ductility than the given ductility. While the exposure of the thermal barrier layer (i.e. ceramic), whose ductility is too low at the temperatures considered, to the gas stream leads to chipping and erosion when a solid particle impinges on the component, the higher ductility of the protective coating causes the same to "catch" the particle and prevent any further damage.

As above, the protective coating is a silicide coating which may include $MoSi_2$ or consist essentially of $MoSi_2$.

In accordance with a further feature of the invention, the thermal barrier layer contains a ceramic as a principal constituent, which is preferably columnar grained ceramic.

In accordance with yet a further feature of the invention, the article includes a bonding layer disposed between the thermal barrier layer and the substrate and bonding the thermal barrier layer to the substrate.

In accordance with yet an added feature of the invention, the bonding layer contains a material selected from the group consisting of intermetallic aluminide compounds and MCrAlY alloys.

With the above and other objects in view there is also provided a method of protecting an article of manufacture having a substrate formed of a nickel or cobalt-based superalloy against corrosive and erosive attack. The method comprises coating a substrate formed of a nickel or cobalt-based superalloy with a silicide coating.

In accordance with yet an additional mode of the invention, the substrate is coated by thermal spraying.

In accordance with again an additional mode of the invention, the substrate is coated by physical vapor deposition.

In accordance with yet another mode of the invention, there is provided a method of protecting an article of manufacture having a substrate formed of a nickel or cobalt-based superalloy against corrosive and erosive attack. The method comprises: applying a thermal barrier layer to a substrate formed of a nickel or cobalt-based superalloy, the thermal barrier layer having a given ductility; and coating the thermal barrier layer with a protective coating, the protective coating having a relatively higher ductility than the given ductility.

The thermal barrier layer may be applied to the substrate by thermal spraying, atmospheric plasma spraying or physical vapor deposition, the process to be applied to be selected in accordance with the specification of the thermal barrier layer and in conformance with the knowledge of those skilled in the art. In accordance with again another mode of the invention, the method further comprises a step of applying a bonding layer on the substrate prior to applying the thermal barrier layer.

Finally, there is provided a method of protecting an article of manufacture having a substrate formed of a nickel or cobalt-based superalloy and having a damaged silicide coating disposed thereon against corrosive and erosive attack, the method which comprises: providing an article of manufacture having a substrate formed of a nickel or cobalt-based superalloy and having a damaged silicide coating disposed thereon; and coating the article with a new silicide coating.

Other features which are considered as characteristic for the invention are set forth in the appended claims.

Although the invention is illustrated and described herein as embodied in an erosion/corrosion protective coating for high-temperature components and a method of protecting such components, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
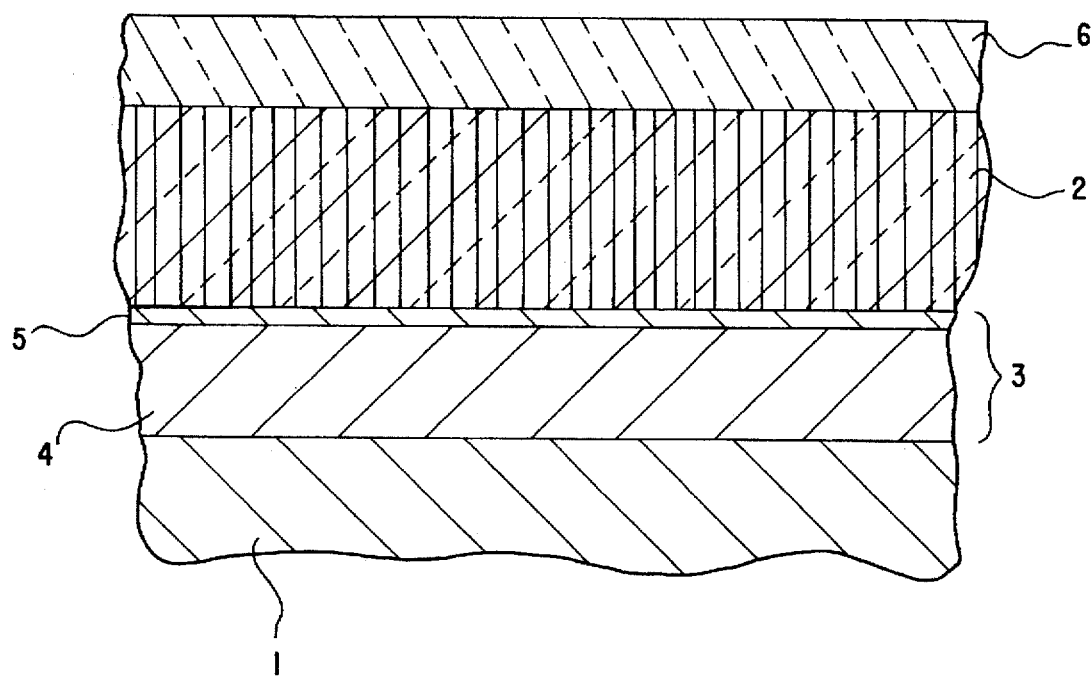
FIG. 1 is a partial sectional view taken through a component with a substrate and a protective coating system incorporating a silicide coating; the section is taken along the lines I—I in FIG. 2.

Referring now to the figures of the drawing in detail and first, particularly, to FIG. 1 thereof, there is seen a substrate 1 of an article of manufacture, in particular a gas turbine component, which in operation is subject to a heavy thermal load and concurrently to corrosive and erosive attack. The substrate 1 is formed of a material which is suitable to provide strength and structural stability when subjected to a heavy thermal load and eventually an additional mechanical load by severe forces like centrifugal forces. A material which is widely recognized and employed for such a purpose in a gas turbine engine is a nickel or cobalt-based superalloy.

In order to limit the thermal load imposed on the substrate 1, it has a thermal barrier layer 2 disposed thereon. The thermal barrier layer 2 is made from a columnar grained ceramic, in particular consisting essentially of stabilized or partly stabilized zirconia. The thermal barrier layer 2 is anchored to the substrate 1 by means of an intermediate layer 3. This intermediate layer 3 is made by coating the substrate 1 with an MCrAlY layer 4 which consists of an MCrAlY alloy and preferably of an MCrAlY alloy as described in one of the above-mentioned U.S. Pat. Nos. 5,154,885, 5,268,238, 5,273,712 and 5,401,307 to Czech et al. (incorporated herein by reference). A thin alumina layer 5 is developed on the MCrAlY layer 4. The alumina layer 5 serves as an anchor for the thermal barrier layer 2.

As a novel feature, a silicide coating 6 is disposed on the thermal barrier layer 2. The silicide coating 6 has, at temperatures higher than 900° C., a ductility which is substantially higher than a ductility of the ceramic forming the thermal barrier layer 2 and it is thus much more suited to withstand erosive attack than the ceramic. Any solid particles suspended in a gas stream flowing around the component and hitting the silicide coating 6 will be stopped and retained therein, eventually causing a slight deformation of the silicide coating 6 but most likely no cracking or spalling thereof. As the silicide coating 6 is chemically inert to a high degree, it also withstands corrosive attack at the temperatures in question and thus provide excellent protection for the thermal barrier layer 2. The thermal barrier layer 2 combines well with the silicide coating 6 to provide threefold protection for the substrate 1, namely protection against corrosive and erosive attack as well as protection against excessive thermal loading.

The silicide coating 6 is particularly made of a metal silicide, for example a compound like $MnSi_2$, $MoSi_2$ or $WSi_2$. Preferably, the silicide coating is made from $MoSi_2$. The compound in particular can be applied by thermal spraying or physical vapor deposition, and it has a coefficient of thermal expansion which varies at most only slightly from the coefficients of thermal expansion of the other materials involved (less than $3*10^{-6}$/K difference) and thus will not give rise to considerable strains under thermal load. Also, the bonding of $MoSi_2$ to the other materials is excellent. Taking all these features into account, it has been found that $MoSi_2$ provides excellent protection, lasting at least for a time period corresponding to a reasonably selected time period between two revisions of the component, in whose turns it may be inspected and have a new silicide coating 6 applied thereto, if necessary.

Figure 2:
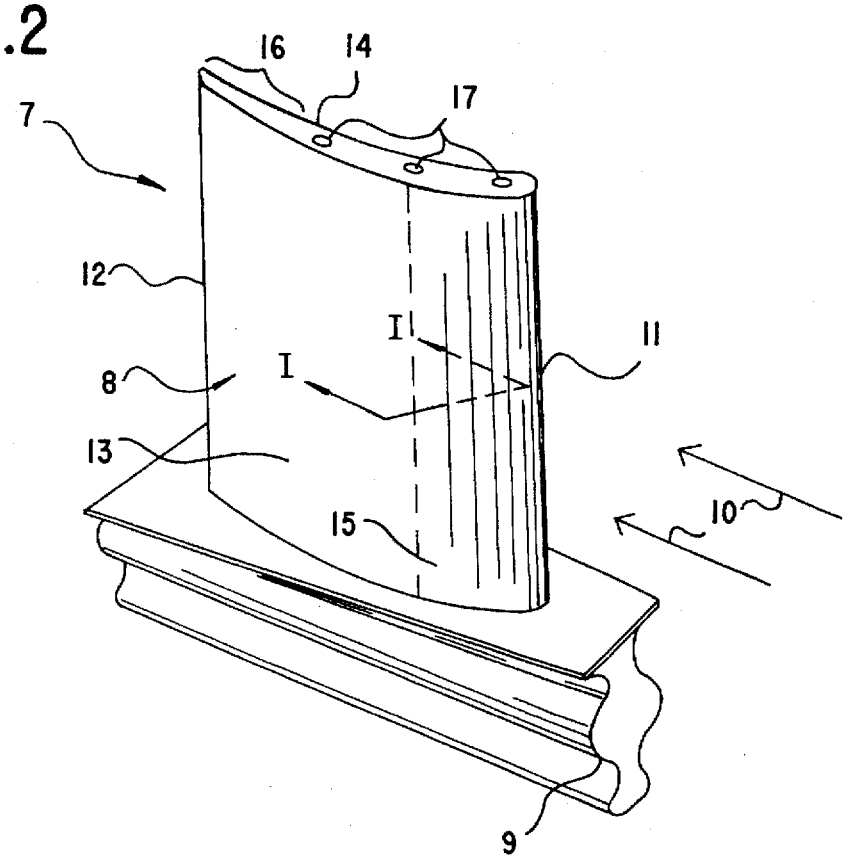
FIG. 2 is a perspective view of a gas turbine airfoil component comprising the substrate and protective coating system shown in FIG. 1.

FIG. 2 shows the complete gas turbine component, namely a gas turbine airfoil component 7, in particular a turbine blade.

The component 7 has an airfoil portion 8, which in operation forms an "active part" of the gas turbine engine, and a mounting portion 9, at which the component 7 is fixedly held in its place. During operation, the airfoil portion 8 is subjected to a hot gas stream 10 streaming therealong. As determined by its function, the airfoil portion 8 has a leading edge 11 where the gas stream 10 meets it and a trailing edge 12 where the gas stream 10 leaves it. The edges 11 and 12 are connected by a convex suction side 13 and a concave pressure side 14. In operation, the gas stream 10 develops a relatively high pressure at the pressure side 14 and a relatively low pressure at the suction side 13, thus giving rise to a pressure differential across the airfoil portion 8 and causing a turbine, to which the component 7 belongs, to rotate. The hot gas stream 10 carries oxygen, giving rise to oxidation-type corrosion attack, other chemicals, giving rise to etching-type corrosion attack, as well as solids in the form of particles dispersed therein, which give rise to an erosive attack. The erosive attack occurs mainly at a leading edge 11 of the airfoil portion 8 as defined by the gas stream 10 and a critical region 15 of the airfoil portion 8 which encompasses the leading edge 11 and which may be defined as a whole to encompass all parts of the airfoil portion 8 adjacent to the leading edge 11 which may be directly hit by a small particle brought along by the stream 10. Another critical region 16 is located on the pressure side 14 adjacent to the trailing edge 12. In operation, the gas stream 10 is forced to follow the contour of the pressure side 14. A particle swept along with the gas stream 10 might by the action of a centrifugal force be lead onto a trajectory being less skewed than the gas stream 10 itself and thus collide with the pressure side 14. Such a collision is most likely to happen near the trailing edge 12, whereby the critical region 16 is defined there.

The silicide coating 6 is to be applied on the component 7 at least over the critical regions 15 and 16 and preferably over the whole airfoil portion 8.

Cooling channels 17 are formed in the component 7, in order to further reduce a thermal load imposed thereon during operation. It is important, however, that cooling is done usually by tapping compressed air from the gas turbine engine, thereby reducing the amount of air available for combustion. As this is generally desired to be kept low, an excellent protection of the component 7 including protection against an excessive thermal load by a coating system is highly advantageous.

Figure 3:
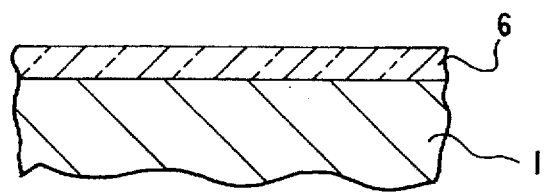
FIG. 3 is a view similar to that of FIG. 1 showing an alternative embodiment.
Figure 4:
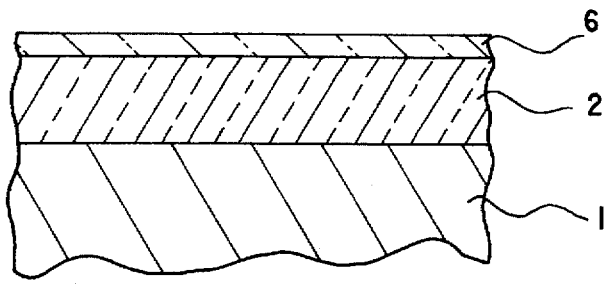
FIG. 4 is a similar view of yet another embodiment.

With reference to FIGS. 3 and 4, a layer of the silicide may be deposited directly on the substrate. Alternatively, the protective coating for the component may comprise only a ceramic barrier layer 2 which is itself protected with the silicide coating according to the invention.

The present invention satisfies these needs by providing a compound in coating systems featuring threefold protection, namely against corrosion, erosion and excessive thermal loads.

I claim:

1. An article of manufacture being subject to erosive and corrosive attack, comprising:
   a substrate, formed of a nickel or cobalt-based superalloy;
   a thermal barrier layer disposed on said substrate and having a given ductility; and
   a protective coating disposed on said thermal barrier layer and having a relatively higher ductility than the given ductility.

2. The article according to claim 1, wherein said protective coating is a silicide coating.

3. The article according to claim 1, wherein said protective coating contains $MoSi_2$.

4. The article according to claim 1, wherein said protective coating consists essentially of $MoSi_2$.

5. The article according to claim 1, wherein said thermal barrier layer contains a ceramic.

6. The article according to claim 1, wherein said thermal barrier layer is a columnar grained ceramic.

7. The article according to claim 1, comprising an bonding layer disposed between said thermal barrier layer and said substrate and bonding said thermal barrier layer to said substrate.

8. The article according to claim 7, wherein said bonding layer contains a material selected from the group consisting of intermetallic aluminide compounds and MCrAlY alloys.

9. The article according to claim 1, wherein said substrate, said thermal barrier layer and said protective coating form a gas turbine airfoil component comprising an airfoil portion and a holding portion, said airfoil portion being defined as to be exposed to a gas stream streaming along the article during operation, having a leading edge and a trailing edge as defined by the gas stream streaming along, and having a convex suction side and a concave pressure side, both connecting said leading edge to said trailing edge.

10. The article according to claim 9, wherein said silicide coating is disposed on and covers a critical region on said airfoil encompassing said leading edge.

11. The article according to claim 9, wherein said silicide coating is disposed on and covers a critical region on said pressure side adjacent to said trailing edge.

12. The article according to claim 9, wherein said airfoil portion has a critical region defined as to be subject to an erosive attack by particles dispersed in the gas stream, and said critical region being covered by said protective coating.

13. A method of protecting an article of manufacture and having a substrate formed of a nickel or cobalt-based superalloy against corrosive and erosive attack, the method which comprises:
   applying a thermal barrier layer to a substrate formed of a nickel or cobalt-based superalloy, the thermal barrier layer having a given ductility; and
   coating the thermal barrier layer with a protective coating, the protective coating having a relatively higher ductility than the given ductility.

14. The method according to claim 13, wherein the step of applying a thermal barrier layer comprises applying a bonding layer on the substrate prior to applying the thermal barrier layer.

15. The method according to claim 13, wherein the coating step comprises coating the thermal barrier layer with a silicide coating.

16. The method according to claim 13, which comprises coating the thermal barrier layer by thermal spraying.

17. The method according to claim 13, which comprises coating the thermal barrier layer by physical vapor deposition.

18. A method of protecting an article of manufacture having a substrate formed of a nickel or cobalt-based superalloy and having a damaged silicide coating disposed thereon against corrosive and erosive attack, the method which comprises:
   providing an article of manufacture having a substrate formed of a nickel or cobalt-based superalloy and having a damaged silicide coating disposed thereon; and
   coating the article with a new silicide coating.

19. A method of protecting an article of manufacture having a substrate formed of a nickel or cobalt-based superalloy, having a thermal barrier layer applied on the substrate and a damaged protective coating disposed on the thermal barrier layer, the method which comprises:
   providing an article of manufacture having a substrate formed of a nickel or cobalt-based superalloy, having a thermal barrier layer having a given ductility applied thereon and having a damaged protective coating disposed on the thermal barrier layer; and
   coating the thermal barrier layer with a new protective coating, the new protective coating having a relatively higher ductility than the given ductility.

* * * * *